United States Patent
Garriga et al.

(10) Patent No.: US 9,516,789 B2
(45) Date of Patent: Dec. 6, 2016

(54) SYSTEMS AND METHODS FOR COOLING OF POWER ELECTRONIC DEVICES

(75) Inventors: Ruldolph Garriga, Los Altos, CA (US); Michael Kubic, Mountain View, CA (US)

(73) Assignee: Clean Wave Technologies, Inc., Mountain View, CA (US)

( * ) Notice: Subject to any disclaimer, the term of this patent is extended or adjusted under 35 U.S.C. 154(b) by 159 days.

(21) Appl. No.: 14/115,863

(22) PCT Filed: Sep. 19, 2011

(86) PCT No.: PCT/US2011/052074
§ 371 (c)(1),
(2), (4) Date: Jun. 30, 2014

(87) PCT Pub. No.: WO2012/150953
PCT Pub. Date: Nov. 8, 2012

(65) Prior Publication Data
US 2014/0347820 A1  Nov. 27, 2014

Related U.S. Application Data

(60) Provisional application No. 61/482,878, filed on May 5, 2011.

(51) Int. Cl.
*H05K 7/00* (2006.01)
*H05K 5/00* (2006.01)
(Continued)

(52) U.S. Cl.
CPC ........... *H05K 7/2039* (2013.01); *H01L 23/367* (2013.01); *H05K 7/209* (2013.01); *H01L 2924/0002* (2013.01)

(58) Field of Classification Search
CPC ..................................................... H05K 7/20
(Continued)

(56) References Cited

U.S. PATENT DOCUMENTS

| 2001/0038310 A1 | 11/2001 | Olofsson et al. |
| 2003/0100197 A1 | 5/2003 | Veitschegger et al. |

(Continued)

FOREIGN PATENT DOCUMENTS

CN   101409515 A   4/2009

OTHER PUBLICATIONS

International search report and written opinion dated Apr. 24, 2012 for PCT Application No. US2011/52074.

(Continued)

*Primary Examiner* — Jerry Wu
(74) *Attorney, Agent, or Firm* — Wilson Sonsini Goodrich & Rosati

(57) ABSTRACT

The invention provides systems and methods for cooling of power electronic devices with an optimized electromechanical structure. A power electronic device may comprise one or more power transistor components, one or more capacitor components, one or more power interconnect components that may be in electrical communication with the one or more power transistor components and the one or more capacitor components, and one or more heat sink components. The one or more power transistor components and the one or more capacitor components may be in thermal communication with the one or more heat sink components, and each may be located on substantially opposite sides of the one or more heat sink components, such that heat may be transferred from the one or more power transistor components and the one or more capacitor components to the same one or more heat sink components.

16 Claims, 1 Drawing Sheet

(51) Int. Cl.
*H05K 7/20* (2006.01)
*H01L 23/367* (2006.01)
(58) Field of Classification Search
USPC .................................... 361/679.01–679.03
See application file for complete search history.

(56) References Cited

U.S. PATENT DOCUMENTS

2006/0291261 A1   12/2006  Ohnishi et al.
2010/0259898 A1* 10/2010  Kimura ................. H05K 7/209
                                                      361/704

OTHER PUBLICATIONS

European search report and search opinion dated Feb. 1, 2016 for EP Application No. 11864749.4.

* cited by examiner

SYSTEMS AND METHODS FOR COOLING OF POWER ELECTRONIC DEVICES

CROSS-REFERENCE

This application claims the benefit of U.S. Provisional Application No. 61/482,878, filed May 5, 2011, which is incorporated herein by reference in its entirety.

BACKGROUND OF THE INVENTION

Power electronic devices have limitations due to the overheating of internal components. The electromechanical structure of the internal components of power electronic devices is also an important factor that may affect electrical and thermal performance. A desire exists to minimize the size and weight of power electronic devices, especially in mobile applications, such as electric and hybrid electric vehicles. With improved cooling of internal components, it is possible to design a power electronic device to produce higher power in a more compact and lower weight package as compared to traditional designs. The improved cooling may facilitate increasing the operating current of the internal components, which may translate directly into higher power, and consequently higher power density of the power electronic device. The improved cooling may also provide for greater thermal operating headroom for the internal components, which may translate into higher reliability of the internal components, and thus higher reliability of the power electronic device overall. Concurrently optimizing the electromechanical structure of the internal components of the power electronic device may also provide for improved electrical and thermal performance in a more compact and lower weight package, also contributing to higher power density.

Thus, a need exists for improved systems and methods for power electronic devices, which may provide improved cooling for critical internal components of power electronic devices, and concurrently may provide an optimized or improved electromechanical structure for the internal components, enabling high reliability and high power density.

SUMMARY OF THE INVENTION

The invention provides systems and methods for cooling of power electronic devices with an optimized electromechanical structure. Various aspects of the invention described herein may be applied to any of the particular applications set forth below or for any other types of power electronic devices. The invention may be applied as a standalone system or method, or as part of an integrated system, such as in a vehicle. It shall be understood that different aspects of the invention can be appreciated individually, collectively, or in combination with each other.

An aspect of the invention may be directed to a power electronic device comprising one or more power transistor components, one or more capacitor components, one or more power interconnect components that may be in electrical communication with the one or more power transistor components and the one or more capacitor components, and one or more heat sink components. The one or more power transistor components and the one or more capacitor components may be in thermal communication with the one or more heat sink components, and each may be located on substantially opposite sides of the one or more heat sink components, such that heat may be transferred from the one or more power transistor components and the one or more capacitor components to the same one or more heat sink components.

A method for cooling a power electronic device may be provided in accordance with another aspect of the invention. The method may comprise providing one or more power transistor components, one or more capacitor components, one or more power interconnect components that may be in electrical communication with the one or more power transistor components and the one or more capacitor components, and one or more heat sink components, wherein the one or more power transistor components and the one or more capacitor components may be in thermal communication with the one or more heat sink components. The method may also include locating the one or more power transistor components and the one or more capacitor components on substantially opposite sides of the one or more heat sink components, such that heat may be transferred from the one or more power transistor components and the one or more capacitor components to the same one or more heat sink components, thereby cooling the one or more power transistor components and the one or more capacitor components.

Other goals and advantages of the invention will be further appreciated and understood when considered in conjunction with the following description and accompanying drawings. While the following description may contain specific details describing particular embodiments of the invention, this should not be construed as limitations to the scope of the invention but rather as an exemplification of preferable embodiments. For each aspect of the invention, many variations are possible as suggested herein that are known to those of ordinary skill in the art. A variety of changes and modifications can be made within the scope of the invention without departing from the spirit thereof.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

While preferable embodiments of the invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention.

Figure 1A:
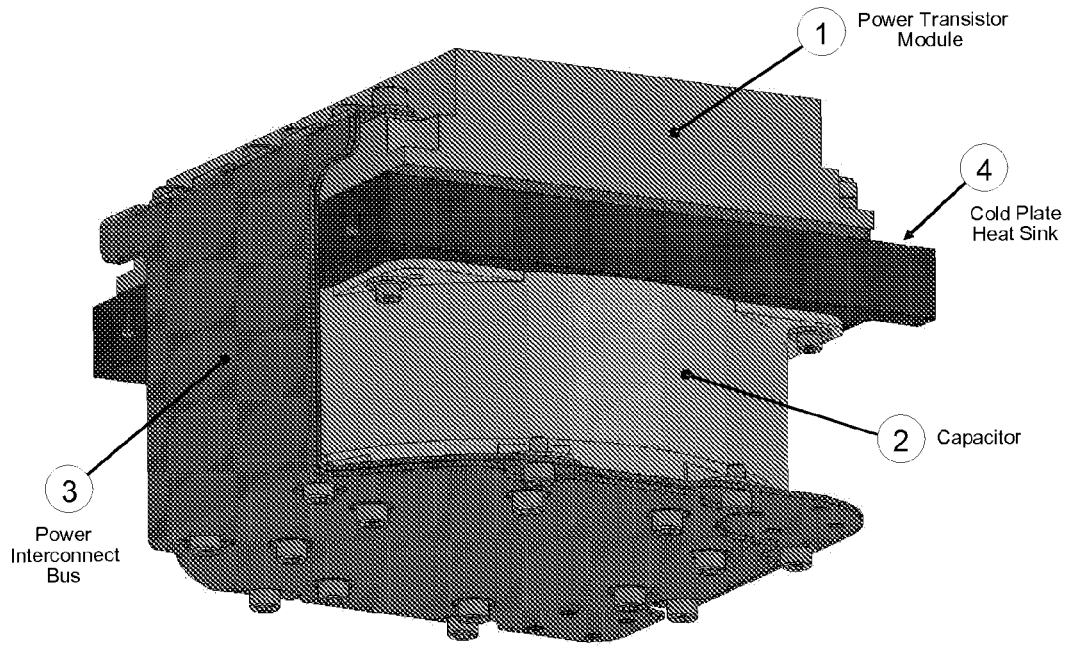
FIG. 1A shows internal components of a power electronic device in accordance with an embodiment of the invention.

FIG. 1A shows internal components of a power electronic device in accordance with an embodiment of the invention. In some embodiments of the invention, the power electronic device may be a power converter, such that the device may function, for example, to convert DC power to AC power, AC power to DC power, DC power to DC power at a different voltage or varying voltages, or AC power to AC power at a different voltage and/or frequency or varying voltages and/or frequencies, or any combination thereof. For example, in some embodiments, the power electronic device may be a three-phase variable frequency AC inverter that may be used to drive an AC electric machine. Examples of an AC electric machine may include a motor, generator, or any sort of machine that may require some form of AC electric power for operation. Alternatively, the power electronic device may be any type of power converter, inverter, rectifier, or any type of device that may include some form of power transistor component and some form of capacitor component, and may require some form of cooling and/or electrical and mechanical interconnection for those components.

The power electronic device may be utilized in a system. For example, the device may be used in a vehicle, such as an automobile, motorcycle, truck, van, bus, or other type of passenger, commercial, or industrial vehicle, train or other type of railed vehicle, watercraft, aircraft, or any other type of vehicle, or other type of commercial or industrial machinery or equipment.

The power electronic device may operate at high current levels, and may produce higher power than conventional devices of the same size and weight. For example, the power electronic device may operate at currents of about 50 A, 100 A, 200 A, 500 A, or 1,000 A or more and may produce power of about 20 kW, 50 kW, 100 kW, 200 kW, or 500 kW or more. The integrated cooling and electromechanical structure may enable higher power density of the power electronic device by providing for cooling of the critical internal components, as well as increasing or optimizing the performance and packaging density of the electrical and mechanical interconnections.

Figure 1B:
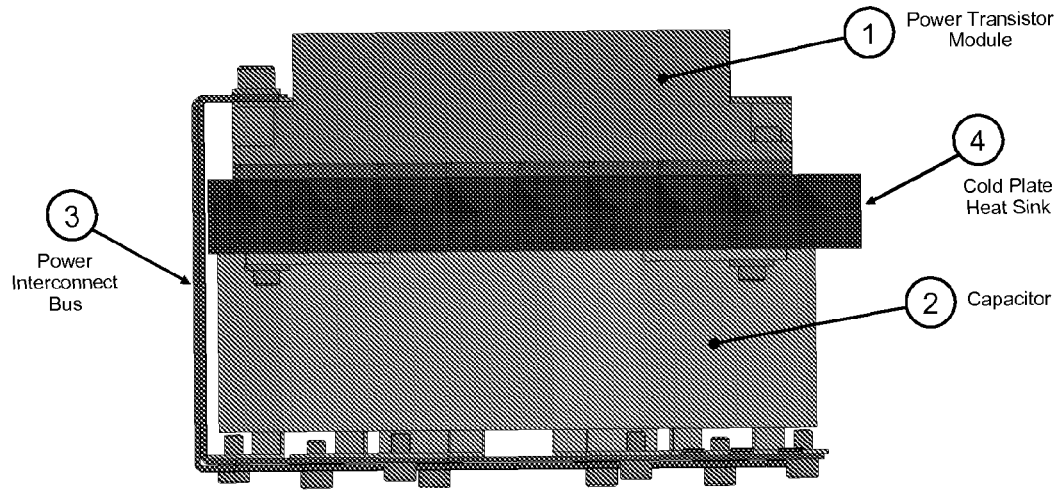
FIG. 1B shows an alternate view of the internal components of a power electronic device in accordance with an embodiment of the invention.

FIG. 1B shows an alternate view of the internal components of a power electronic device with an electromechanical structure and cooling method in accordance with an embodiment of the invention. The internal components of a power electronic device may comprise one or more power transistor components 1, one or more capacitor components 2, one or more power interconnect components 3 that may be in electrical communication with the one or more power transistor components 1 and the one or more capacitor components 2, and one or more heat sink components 4. The one or more power transistor components 1 and the one or more capacitor components 2 may be in thermal communication with the one or more heat sink components 4. The one or more power transistor components and the one or more capacitor components may or may not directly contact the one or more heat sink components.

In one example, the one or more power transistor components may have a surface that contacts a surface of the one or more heat sink components. The power transistor component surface and the heat sink component surface may be complementary in shape. For example, both the power transistor component surface and the heat sink component surface may be substantially flat, and may provide a robust thermal connection. Likewise, the one or more capacitor components may have a surface that contacts a surface of the one or more heat sink components. The capacitor component surface and the heat sink component surface may be complementary in shape. For example, both the capacitor component surface and the heat sink component surface may be substantially flat, and may provide a robust thermal connection.

In another example, the one or more power transistor components may have a surface that may contact a surface of one or more intermediate components, and the one or more intermediate components may have a surface that may contact a surface of the one or more heat sink components. The one or more intermediate components may or may not be constructed of a material of high thermal conductivity. Furthermore, the one or more intermediate components may or may not be constructed of a material of high electrical conductivity. In some instances, the material may be an electrically insulating material. The one or more intermediate components may be configured to provide high or maximized thermal conductivity between the one or more power transistor components and the one or more heat sink components. Similarly, the one or more capacitor components may have a surface that may contact a surface of one or more intermediate components, and the one or more intermediate components may have a surface that may contact a surface of the one or more heat sink components. The one or more intermediate components may or may not be constructed of a material of high thermal conductivity. Furthermore, the one or more intermediate components may or may not be constructed of a material of high electrical conductivity. In some instances, the material may be an electrically insulating material. The one or more intermediate components may be configured to provide high or maximized thermal conductivity between the one or more capacitor components and one or more heat sink components.

In some embodiments, substantially no gaps or spaces may be provided between a heat sink component and an intermediate component, power transistor component, and/or capacitor component. For example, in some instances, substantially no gaps or spaces are provided between a power transistor component and a heat sink component, and/or between a capacitor component and a heat sink component. In some instances, no intermediate components are provided between the power transistor component and the heat sink component, and/or between the capacitor component and the heat sink component. In other instances, one or more intermediate components may be provided between the power transistor component and the heat sink component, and/or between the capacitor component and the heat sink component. The one or more intermediate components may assist with heat transfer between the power transistor component and the heat sink component, and/or between the capacitor component and the heat sink component. For example, the one or more intermediate components may comprise some type of thermal interface material, such as a thermal paste or a thermal pad. The one or more intermediate components may have low electrical conductivity. For example, the electrical conductivity of the one or more intermediate components may be lower than the electrical conductivity of a material forming a power interconnect component. In some cases, the one or more intermediate components may comprise one or more power interconnect components. Alternatively, the one or more intermediate components may not comprise one or more power interconnect components.

A power transistor component surface may directly contact a heat sink component surface, such that a large portion of the surface area of the power transistor component that is facing the heat sink component contacts the heat sink surface. For example, greater than 50%, 60%, 70%, 80%, 90%, 95%, 99%, 99.5%, or 99.9% of the power transistor component surface that is facing the heat sink component may contact the heat sink surface or be configured to contact the heat sink surface. One or more intermediate components located between the power transistor component surface and the heat sink component surface that may assist with heat transfer between the power transistor component and the heat sink component may be considered integral to the power transistor component and/or the heat sink component, such that the power transistor component may be considered to directly contact the heat sink. Similarly, a capacitor component surface may directly contact a heat sink component surface, such that a large portion of the surface area of the capacitor component that is facing the heat sink component contacts the heat sink surface. For example, greater than 50%, 60%, 70%, 80%, 90%, 95%, 99%, 99.5%, or 99.9% of the capacitor component surface that is facing the heat sink component may contact the heat sink surface or be configured to contact the heat sink surface. One or more intermediate components located between the capacitor component surface and the heat sink component surface that may assist with heat transfer between the capacitor component and the heat sink component may be considered integral to the capacitor component and/or the heat sink component, such that the capacitor component may be considered to directly contact the heat sink. In some embodiments, substantially all of a power transistor component surface that is facing the heat sink component may directly contact the heat sink, and/or substantially all of a capacitor component surface that is facing the heat sink component may directly contact the heat sink.

The one or more power transistor components 1 and the one or more capacitor components 2 may be located on substantially opposite sides of the one or more heat sink components 4, such that heat may be transferred from the one or more power transistor components 1 and the one or more capacitor components 2 to the same one or more heat sink components 4, thereby cooling the one or more power transistor components and the one or more capacitor components. In some implementations, the one or more power transistor components and the one or more capacitor components do not directly contact one another, but are each in simultaneous thermal communication with the one or more heat sink components. Furthermore, the one or more power transistor components and the one or more capacitor components may each be in simultaneous thermal communication with the same one or more heat sink components. Additionally, the one or more power transistor components and the one or more capacitor components may each be in simultaneous direct physical contact with the same one or more heat sink components.

A heat sink component may have a first side and an opposite or substantially opposite second side. In some instances, the first and second side may be substantially parallel. In other instances, the first and second side may be oriented at an angle, which may include but is not limited to a 1 degree angle, 5 degree angle, 10 degree angle, 15 degree angle, 30 degree angle, 45 degree angle, 60 degree angle, 75 degree angle, 80 degree angle, 85 degree angle, or 89 degree angle. One or more power transistor components may be in thermal communication with the heat sink through the first side. One or more capacitor components may be in thermal communication with the heat sink through the second side. A heat sink may have a third side, a forth side, or any number of additional sides connecting the first and second sides. In some implementations, the third side, the forth side, or the any numbers of additional sides do not have power transistor components or capacitor components thereon. Alternatively, the third side, the forth side, or the any number of additional sides may have one or more power transistor components and/or one or more capacitor components thereon, in addition to or in place of the one or more power transistor components that may be in thermal communication with the first side or the one or more capacitor components that may be in thermal communication with the second side.

In some embodiments, the one or more power interconnect components 3, which may be in electrical communication with the one or more power transistor components 1 and the one or more capacitor components 2, may be constructed of a material with high electrical conductivity, such as copper, which may enable the transmission of high electrical current with low resistive loss. Additional examples of such material may include other metals, such as aluminum, brass, silver, gold, iron, steel, tin, or lead, or any other electrically conductive materials, or any alloys, mixtures, or combinations thereof. The one or more power interconnect components 3 may also be configured such that the inductance in the electrical transmission circuit between the one or more capacitor components 2 and the one or more power transistor components 1 is low or minimized.

The one or more power interconnect components may or may not directly contact the one or more power transistor components or the one or more capacitor components. In some instances, the one or more power interconnect components may contact the one or more power transistor components through one or more electrically conductive intermediate components or materials. Similarly, in some instances, the one or more power interconnect components may contact the one or more capacitor components through one or more electrically conductive intermediate components or materials.

The one or more power interconnect components may or may not contact the one or more heat sink components. In one example, the one or more power interconnect components may contact the one or more power transistor components and may contact the one or more capacitor components without contacting the one or more heat sink components. Furthermore, the one or more power interconnect components may contact the one or more power transistor components on a side that is substantially opposite the side of the one or more power transistor components that may be in thermal communication with the one or more heat sink components. Similarly, the one or more power interconnect components may contact the one or more capacitor components on a side that is substantially opposite the side of the one or more capacitor components that may be in thermal communication with the one or more heat sink components. The one or more power interconnect components may have a configuration that wraps around the one or more power transistor components and the one or more capacitor components, such that the one or more power interconnect components may simultaneously contact the one or more power transistor components on a side that is substantially opposite the side that may be in thermal communication with the one or more heat sink components, and may also contact the one or more capacitor components on a side that is substantially opposite the side that may be in thermal communication with the one or more heat sink components. Alternatively or additionally, the one or more power interconnect components may contact any one or more sides of the one or more power transistor components and/or may contact any one or more sides of the one or more capacitor components.

In some instances, the one or more power interconnect components may not contact the one or more heat sink components. The one or more power interconnect components may pass outside of and/or along one or more sides of a heat sink component without contacting the heat sink component. The one or more power interconnect components may or may not pass through a hole or opening in a heat sink component without contacting the heat sink component. In some implementations, the one or more power interconnect components may not pass through any portions of the one or more heat sink components. The one or more power interconnect components may pass around and/or along the exterior of the one or more heat sink components.

In another example, the one or more power interconnect components may contact the one or more power transistor components and may contact the one or more capacitor components, and may also contact and/or be in thermal communication with the one or more heat sink components. The one or more power interconnect components may contact the one or more power transistor components on substantially the same side of the one or more power transistor components that may be in thermal communication with the one or more heat sink components, and the one or more power interconnect components may also contact and/or be in thermal communication with the one or more heat sink components. Similarly, the one or more power interconnect components may contact the one or more capacitor components on substantially the same side of the one or more capacitor components that may be in thermal communication with the one or more heat sink components, and the one or more power interconnect components may also contact and/or be in thermal communication with the one or more heat sink components.

The one or more power interconnect components may or may not directly contact the one or more heat sink components. In some instances, the one or more power interconnect components may have a surface that contacts a surface of the one or more heat sink components. The power interconnect component surface and the heat sink component surface may be complementary in shape. For example, both the power interconnect component surface and the heat sink component surface may be substantially flat, and may provide a robust thermal connection. A power interconnect component surface may directly contact a heat sink component surface, such that a large portion of the surface area of the power interconnect component that is facing the heat sink component contacts the heat sink surface. For example, greater than 50%, 60%, 70%, 80%, 90%, 95%, 99%, 99.5% or 99.9% of a power interconnect component surface that is facing a heat sink component surface may contact the heat sink surface or be configured to contact the heat sink surface. In some embodiments, substantially no gaps or spaces may be provided between the power interconnect component surface and the heat sink component surface on a side of the heat sink component that is facing the power transistor component. In other embodiments, substantially no gaps or spaces may be provided between the power interconnect component surface and the heat sink component surface on a side of the heat sink component that is facing the capacitor component. In other instances, the one or more power interconnect components may have a surface that may contact a surface of one or more intermediate components, and the one or more intermediate components may have a surface that may contact a surface of the one or more heat sink components. The one or more intermediate components may or may not be constructed of a material of high thermal conductivity. Furthermore, the one or more intermediate components may or may not be constructed of a material of high electrical conductivity. In some instances, the material may be an electrically insulating material. The one or more intermediate components may be configured to provide high or maximized thermal conductivity between the one or more power interconnect components and the one or more heat sink components. One or more intermediate components located between the power interconnect component surface and the heat sink component surface that may assist with heat transfer between the power interconnect component and the heat sink component, may be considered integral to the power interconnect component and/or the heat sink component, such that the power interconnect component may be considered to directly contact the heat sink.

In some embodiments, a power interconnect component may have one or more bends, curves, or folds. Any descriptions of bends may also apply to curves or folds, or other surface features or shapes, and vice versa. For example, a power interconnect component may have a wraparound configuration with two or more substantially perpendicular bends to form an angular C-shape. A power interconnect component may have a first bend along one side of a heat sink, and a second bend along another side of a heat sink. A power interconnect component may have a first bend at or near a side of a power transistor component that is substantially opposing a heat sink component, and/or a second bend at or near a side of a capacitor component that is substantially opposing a heat sink component. The first and second bends may enable a power interconnect component to wrap at least partially around a power transistor component and a capacitor component. In some embodiments, at least a portion of a power transistor component, heat sink component, and/or capacitor component may be located between portions of the power interconnect component.

In some embodiments, the one or more power transistor components 1 may be a power semiconductor module, such as an insulated gate bipolar transistor (IBGT) module. Alternatively, in other embodiments, the one or more power transistor components may be any type of power transistor component, device, or apparatus known in the art or later developed, or any configuration, variation, or combination thereof. Furthermore, the one or more power transistor components may have any physical form, structure, or configuration, and may comprise any type of packaging, enclosure, mountings, or connections.

In some examples, the one or more power transistor components 1 may comprise one or more power transistor modules, wherein a plurality of individual power transistor devices may be packaged together in a single enclosure. In other examples, the one or more power transistor components may comprise one or more discrete power transistor devices, wherein single power transistor devices may be packaged separately in individual enclosures. Furthermore, in some instances, the one or more power transistor components may or may not additionally comprise any number of other types of devices along with the power transistor devices, such as diode devices, sensing devices, or any other types of devices or combinations thereof.

The power transistor devices may be any type of semiconductor device and may comprise a semiconductor material such as silicon, germanium, silicon carbide, gallium arsenide, gallium nitride, or any other type of semiconducting material known in the art or later developed, or any combination thereof. The power transistor devices may have any type of transistor structure, such as a bipolar junction transistor (BJT), junction gate field-effect transistor (JFET), metal-oxide-semiconductor field-effect transistor (MOSFET), insulated gate bipolar transistor (IGBT), or any other type of transistor structure known in the art or later developed, or any combination thereof.

In some embodiments, the one or more capacitor components 2 may be a film type capacitor, such as a polypropylene film capacitor. Alternatively, in other embodiments, the one or more capacitor components may be any other type of film capacitor, such as a polyamide film, polycarbonate film, polyester film, polyimide film, polystyrene film, polysulfone film, or polytetrafluoroethylene (PTFE) film capacitor, or any other type of capacitor, such as paper, glass, mica, ceramic, aluminum oxide electrolytic, tantalum oxide electrolytic, oil filled, vacuum, electric double-layer capacitor (EDLC), or any other type of capacitive or electrical energy storage component, device, or apparatus known in the art or later developed, or any configuration, variation, or combination thereof. Furthermore, the one or more capacitor components may have any physical form, structure, or configuration, and may comprise any type of packaging, enclosure, mountings, or connections.

In some embodiments, the one or more power interconnect components 3 may comprise a power interconnect bus. The power interconnect bus may electrically communicate with the one or more power transistor components 1 and the one or more capacitor components 2. In some instances, the power interconnect bus may comprise two or more electrically conductive components. The two or more electrically conductive components may or may not be separated by one or more electrically insulating components or materials. Furthermore, the two or more electrically conductive components may or may not be configured such that the capacitance of the electrical transmission circuit between the one or more capacitor components 2 and the one or more power transistor components 1 is within a desired range.

Alternatively, in other embodiments, the one or more power interconnect components 3 may comprise any type of component, material, or apparatus that may be capable of transferring electrical power between the one or more power transistor components 1 and the one or more capacitor components 2. Furthermore, the one or more power interconnect components may have any physical form, structure, or configuration, and may comprise any type of packaging, enclosure, mountings, or connections. For example, the one or more power interconnect components may include or utilize one or more wires, strips, bars, plates, meshes, nets, blocks, or any configuration, variation, or combination thereof.

Additionally, the one or more power interconnect components 3 may or may not be configured such that the one or more power interconnect components are capable of transferring a specific amount of power between the one or more power transistor components 1 and the one or more capacitor components 2 while limiting the temperature of the one or more power interconnect components to a desired rise above ambient conditions.

In some embodiments, the one or more heat sink components 4 may be a cold plate type heat sink, which may be cooled by directing a fluid to flow through the heat sink, such that heat may be transferred from the heat sink to the fluid, thereby cooling the heat sink. Alternatively, in other embodiments, the one or more heat sink components 4 may be any type of heat sink component, device, or apparatus known in the art or later developed, such that the one or more heat sink components may transfer heat from the one or more power transistor components 1, the one or more capacitor components 2, and/or the one or more power interconnect components 3 to the one or more heat sink components. Furthermore, the one or more heat sink components may have any physical form, structure, or configuration, and may comprise any type of packaging, enclosure, mountings, or connections. In some instances, the one or more heat sink components may transfer heat from the one or more power transistor components, the one or more capacitor components, and/or the one or more power interconnect components to ambient air or conditions. The ambient air or conditions may or may not have actively flowing fluid. Passive or active heat transfer may occur.

The cooling fluid that may be directed to flow though the one or more heat sink components may be any fluid known in the art. A fluid may include a liquid or gaseous fluid. In some embodiments, the cooling fluid may be a gas, such as air; or a liquid, such as water, oil, or a type of liquid dielectric fluid; or a vapor or mist of any such fluids; or any other type of fluid. Any type of coolant known in the art or later developed may be utilized. In some embodiments, a combination of fluids may be provided. For instance, a solution comprised of approximately half water and half ethylene glycol or propylene glycol may be used. A fluid may be selected according to desired thermal, electrical, chemical, or flow properties. For example, the fluid may have a specific heat within a desired range, or may be a fluid that is electrically non-conductive with a resistivity above a desired value, or may be a fluid that is chemically inert or reactive with regard to components comprising the power electronic device, or may be a fluid with a viscosity within a desired range.

The fluid supplied to the power electronic device may or may not be pressurized. In some instances, the fluid may be pressurized by a positive pressure source, such as a pump or compressor. The positive pressure source may be external to the device (e.g., on the inlet side of the device), or may be part of the device. In other embodiments, the fluid may be pressurized by a negative pressure source, such as a vacuum. The negative pressure source may be external to the device (e.g., on the outlet side of the device), or may be part of the device. In some instances, the pressure source may be integral to the power electronic device and may assist with the flow of fluid within the device. Any pressure differential may be created that may assist with fluid flow. Additionally, fluid flow may be assisted by gravity. In some instances, fluid flow may be assisted by convection effects or other temperature differentials.

In some examples, fluid may be contained within a heat sink component, and may flow within the heat sink component. Alternatively, fluid may be provided to the heat sink from an external source. Fluid may exit the heat sink. Fluid entering and exiting a heat sink may be part of a closed loop fluid handling system, or may be part of an open loop system. A heat sink component may have one or more internal conduits that may enable fluid to flow therein. A heat sink component may have one or more channels or fins therein, may be formed of one or more plates, may have a shell and tube configuration, or may have any configuration or features, or may comprise any combination thereof.

An exposed surface of a heat sink component may have a desired material property. In some embodiments, an exposed surface of the heat sink component may be a housing or enclosure that may contain fluid flow features therein. In another example, an exposed surface of the heat sink component may be the outer surface of a thermal block, which may or may not be solid. The exposed surface of the heat sink component may be thermally conductive. Preferably, the exposed surface of the heat sink component may have a high thermal conductivity. The exposed surface of the heat sink component may or may not have a high electrical conductivity. In some instances, the exposed surface of the heat sink component may have a low electrical conductivity or may be electrically insulating.

In some embodiments, contacting a power transistor component and a capacitor component to the same heat sink component may enable the heat sink component to cool both the power transistor component and capacitor component simultaneously. This configuration may require fewer components than if additional heat sink components were utilized to provide separate cooling through individual heat sink components dedicated to the power transistor component and to the capacitor component. Directly contacting the power transistor component and/or capacitor component to the heat sink component may enable effective and/or efficient transfer of heat from the power transistor component and/or capacitor component to the heat sink component. Similarly, contacting the power transistor component and/or capacitor component to the heat sink component through one or more thermally conductive intermediate components may enable effective and/or efficient transfer of heat from the power transistor component and/or capacitor component to the heat sink component. Heat may be transferred from the power transistor component and/or capacitor component to the heat sink component via conduction. Having a relatively large surface area contact between a power transistor component and/or capacitor component and a heat sink component may enable high or maximized rates of conductive heat transfer.

The power electronic device configuration, in accordance with an embodiment of the invention, may enable the power electronic device to have a relatively compact footprint area and/or package volume. For example, the power electronic device may have a footprint area of greater than, less than, and/or equal to about 100 cm$^2$, 200 cm$^2$, or 400 cm$^2$. Furthermore, for example, the power electronic device may have a package height of greater than, less than, and/or equal to about 10 cm, 15 cm, or 20 cm.

All or part of the power electronic device may be surrounded by a housing. The device housing may include any structure or component that surrounds all or part of the device for the purpose of containment, support, and/or protection, or any other similar functions. A structure or component may function as a device housing, or may comprise part of a device housing, and may additionally perform other unrelated functions. The housing may surround all or part of a device assembly, or may surround all or part of any of the individual components of the device. One or more individual structures or components surrounding all or part of one or more individual components of the power electronic device may separately function as device housings, and may also collectively comprise a device housing. It will be apparent to those skilled in the art that the device housing, referred to herein, may also be referenced by other terminology without departing from the description provided herein, including case, frame, enclosure, or other similar terms. The device housing, as referred to herein, may collectively include any and all individual structures and/or components (e.g., a heat sink) that may perform the function of containment, support, and/or protection, or any other similar functions, for the power electronic device or any of the individual components of the power electronic device. In some embodiments, all or part of the device housing may be fluid-sealed.

The power electronic device may utilize high power electrical connections. Reliable high power connections may require low-resistance electrical contact with acceptable current density. Typical maximum current densities in copper DC power connections may be on the order of $2.2 \times 10^6$ A/m$^2$. This may typically limit the temperature rise of the connection to under 30° C. in ambient temperatures over 40° C. See e.g., ANSI C37.20C-1974, IEEE standard 27-1974. In copper three-phase AC power connections, maximum peak current densities of $7 \times 10^6$ A/m$^2$ have traditionally been used in power electronic devices reliably.

It should be understood from the foregoing that, while particular implementations have been illustrated and described, various modifications can be made thereto and are contemplated herein. It is also not intended that the invention be limited by the specific examples provided within the specification. While the invention has been described with reference to the aforementioned specification, the descriptions and illustrations of the preferable embodiments herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A power electronic device comprising:
   one or more power transistor components;
   one or more capacitor components;
   one or more power interconnect components in electrical communication with the one or more power transistor components and the one or more capacitor components, wherein the interconnect component is formed with a plurality of bends to wrap at least partially around both a power transistor component and a capacitor component for electrical connection there between; and
   one or more heat sink components, wherein the one or more power transistor components and the one or more capacitor components are in direct thermal communication with the one or more heat sink components, wherein the one or more power transistor components and the one or more capacitor components are each located on substantially opposite sides of the one or more heat sink components, and wherein the one or more power interconnect components are not in direct thermal communication with the one or more heat sink components.

2. The power electronic device of claim 1 wherein the one or more power transistor components have a surface that contacts a surface of the one or more heat sink components.

3. The power electronic device of claim 1 wherein the one or more capacitor components have a surface that contacts a surface of the one or more heat sink components.

4. The power electronic device of claim 1 wherein the one or more power interconnect components contact the one or more power transistor components on a side that is substantially opposite the side of the one or more power transistor components that is in thermal communication with the one or more heat sink components.

5. The power electronic device of claim 1 wherein the one or more power interconnect components contact the one or more capacitor components on a side that is substantially opposite the side of the one or more capacitor components that is in thermal communication with the one or more heat sink components.

6. The power electronic device of claim 1 wherein substantially no gap is provided between the one or more power transistor components and the one or more heat sink components.

7. The power electronic device of claim 1 wherein substantially no gap is provided between the one or more capacitor components and the one or more heat sink components.

8. A method for cooling a power electronic device comprising: providing one or more power transistor components; providing one or more capacitor components;
   providing one or more power interconnect components in electrical communication with the one or more power transistor components and the one or more capacitor components, wherein the interconnect component is form with a plurality of bends to wrap at least partially around both a power transistor component and a capacitor component for electrical connection there between; and
   providing one or more heat sink components, wherein the one or more power transistor components and the one or more capacitor components are in direct thermal communication with the one or more heat sink components,
   wherein the one or more power transistor components and the one or more capacitor components are each located on substantially opposite sides of the one or more heat sink components, such that heat is transferred from the one or more power transistor components and the one or more capacitor components to the same one or more heat sink components, thereby cooling the one or more power transistor components and the one or more capacitor components; and wherein the one or more power interconnect components are not in direct thermal communication with the one or more heat sink components.

9. The method of claim 8 wherein the one or more power transistor components have a surface that contacts a surface of the one or more heat sink components.

10. The method of claim 8 wherein the one or more capacitor components have a surface that contacts a surface of the one or more heat sink components.

11. The method of claim 8 wherein the one or more power interconnect components contact the one or more power transistor components on a side that is substantially opposite the side of the one or more power transistor components that is in thermal communication with the one or more heat sink components.

12. The method of claim 8 wherein the one or more power interconnect components contact the one or more capacitor components on a side that is substantially opposite the side of the one or more capacitor components that is in thermal communication with the one or more heat sink components.

13. The power electronic device of claim 8 wherein substantially no gap is provided between the one or more power transistor components and the one or more heat sink components.

14. The power electronic device of claim 8 wherein substantially no gap is provided between the one or more capacitor components and the one or more heat sink components.

15. The power electronic device of claim 1, wherein the one or more power interconnect components have two or more bends to form a substantially C-shape.

16. The power electronic device of claim 1, wherein the one or more capacitor components are in direct thermal communication with the one or more heat sinks.

* * * * *